US006418300B1

(12) United States Patent
Laurent

(10) Patent No.: US 6,418,300 B1
(45) Date of Patent: Jul. 9, 2002

(54) METHOD AND DEVICE FOR TRANSMITTING MIXED ANALOG AND DIGITAL SIGNALS BY THE SAME TRANSMITTER

(75) Inventor: Pierre André Laurent, Bessancourt (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/308,651

(22) PCT Filed: Nov. 21, 1997

(86) PCT No.: PCT/FR97/02109

§ 371 (c)(1), (2), (4) Date: Jun. 1, 1999

(87) PCT Pub. No.: WO98/24201

PCT Pub. Date: Jun. 4, 1998

(30) Foreign Application Priority Data

Nov. 29, 1996 (FR) ........................................... 96 14686

(51) Int. Cl.[7] ........................... H04L 27/00; H03C 1/52

(52) U.S. Cl. ......................... 455/45; 455/108; 455/109; 455/47; 375/300; 375/301; 375/320; 375/321

(58) Field of Search ........................... 455/45, 108, 47, 455/109, 104; 375/300, 301, 320, 321

(56) References Cited

U.S. PATENT DOCUMENTS

| | | | | | |
|---|---|---|---|---|---|
| 4,686,705 | A | * | 8/1987 | Smith | 455/109 |
| 5,162,763 | A | * | 11/1992 | Morris | 455/109 |
| 5,438,686 | A | * | 8/1995 | Gehri et al. | 455/108 |
| 5,588,022 | A | * | 12/1996 | Dapper et al. | 455/108 |
| 5,694,419 | A | * | 12/1997 | Lawrence et al. | 455/109 |
| 5,757,854 | A | * | 5/1998 | Hunsinger et al. | 375/260 |
| 5,825,242 | A | * | 12/1998 | Prodan et al. | 455/109 |
| 5,930,687 | A | * | 7/1999 | Dapper et al. | 455/108 |

* cited by examiner

*Primary Examiner*—Lee Nguyen
*Assistant Examiner*—Simon Nguyen
(74) *Attorney, Agent, or Firm*—Oblon, Spivak, McClelland, Maier & Neustadt, P.C.

(57) ABSTRACT

A process for transmitting mixed analog and digital signals. A composite signal is transmitted whose frequency spectrum is composed of a first analog spectrum representative of the amplitude of single-sideband modulation and of a second spectrum composed of multi-subcarriers. The two spectra occupy two disjoint frequency bands. The device may be used for simultaneous broadcast of the same program or its reception by analog or digital receivers.

5 Claims, 5 Drawing Sheets

*FIG. 7*
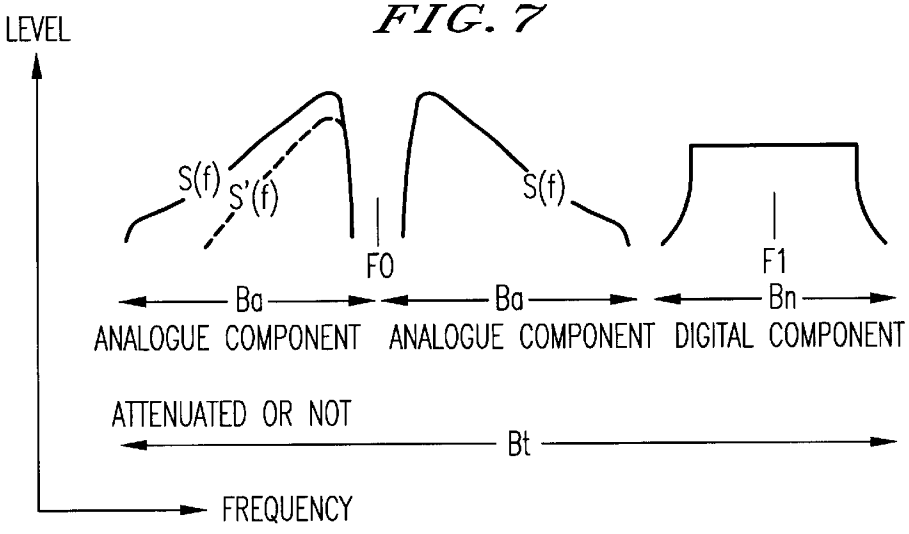
*FIG. 9*
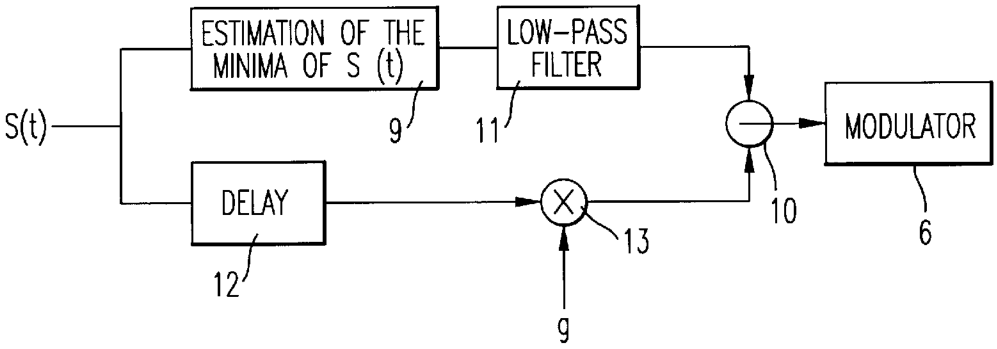
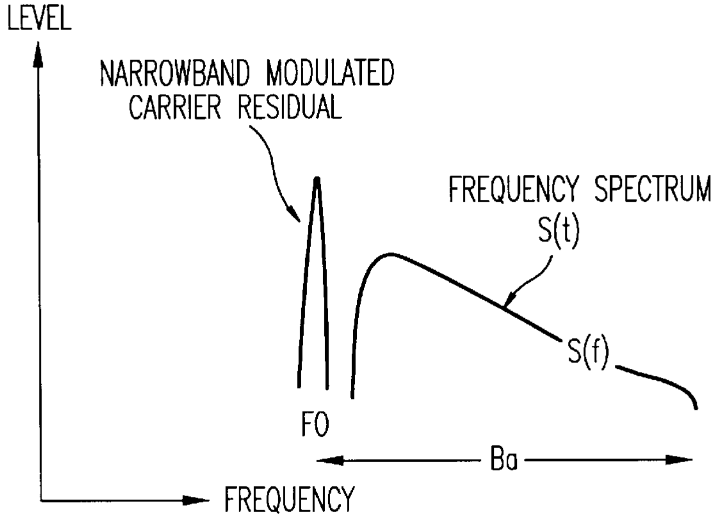
*FIG. 10*

METHOD AND DEVICE FOR TRANSMITTING MIXED ANALOG AND DIGITAL SIGNALS BY THE SAME TRANSMITTER

BACKGROUND OF THE INVENTION

1. Field of the Invention

The present invention relates to a process of mixed analogue and digital radiobroadcasting making it possible to ensure the transition between conventional amplitude-modulation radiobroadcasting systems, for example, and digital radiobroadcasting systems. It applies in particular to the production of a transmitter broadcasting in the short-wave range.

2. Discussion of the Background

For reasons of a technical, political or economic nature, radiobroadcasting transmitters currently used for the radiobroadcasting of programs using amplitude modulation cannot be adapted overnight to the broadcasting of programs in digital form. This suggests, for a relatively long transition period, the coexistence of two systems, one digital the other analogue, which broadcast the same programs. This solution would appear to be very expensive and rather undesirable since it implies that, at the end of this transition period, half the transmitters used for analogue transmission will have to be discarded.

The purpose of the invention is to remedy this situation.

SUMMARY OF THE INVENTION

To this end, the subject of the invention is a process of mixed analogue and digital radiobroadcasting of a radiophonic transmission broadcast by one and the same transmitter and intended to be received either by amplitude-modulation receivers or single-sideband receivers and digital type receivers adapted for the demodulation of multi-subcarriers, characterized in that it consists in transmitting a composite signal whose frequency spectrum is composed of a first analog spectrum representative of the amplitude modulation or of the single sideband and of a second spectrum composed of the multi-subcarriers, the first and second spectra occupying two disjoint frequency bands.

Its subject is also a device for implementing the aforesaid process.

The advantage of the invention is that it allows simultaneous analog and digital radiobroadcasting by one and the same transmitter of a transmission which can be received equally well by an amplitude-modulation receiver available on the market without it being necessary to modify it or change it, as by a receiver fitted with a digital signal demodulator.

BRIEF DESCRIPTION OF THE DRAWINGS

Other characteristics and advantages of the invention will become apparent from the following description given in conjunction with the appended drawings which represent:

FIGS. 4 to 7 illustrates various examples of the generation of a composite signal according to the invention.

FIG. 9 illustrates an embodiment of a device for regulating the level of the residual carrier making up the device of FIG. 8.

FIG. 10 illustrates the general shape of a frequency spectrum obtained by implementing a regulating device in accordance with FIG. 9.

DETAILED DESCRIPTION OF THE PREFERRED EMBODIMENTS

Figure 1:
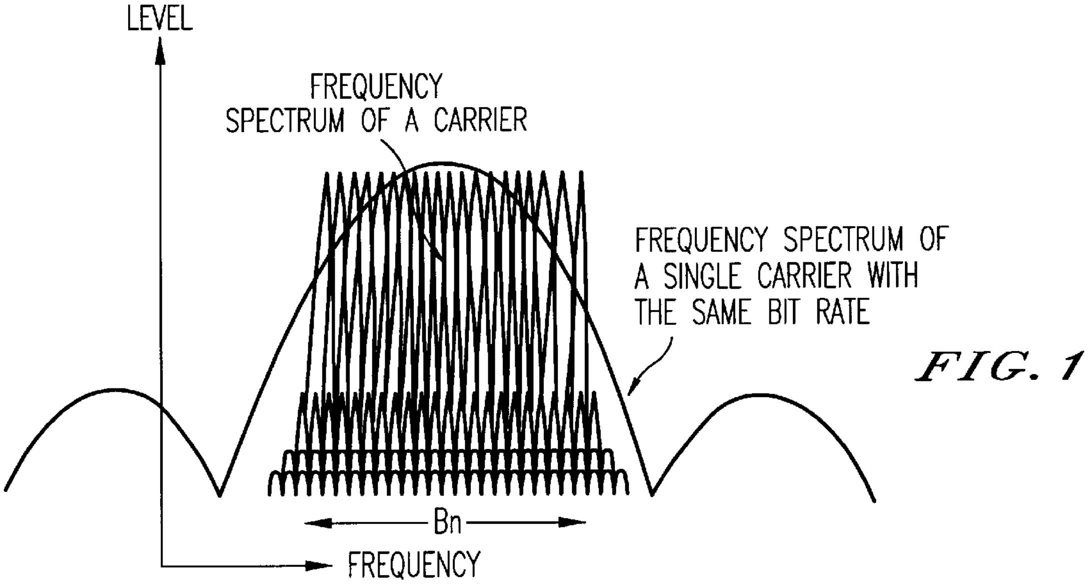
FIG. 1 illustrates the spectral occupancy of a digital transmission conveyed on a single carrier, compared with that obtained in a digital transmission of identical bit rate conveyed on a large number of subcarriers.

To ensure simultaneous radiobroadcasting by a single transmitter of one and the same program which can be received equally well by analog radio sets as by digital radio sets, the transmission signal is produced according to the invention by modulating a composite signal which is the sum of the audiofrequency signal and of a digital signal obtained by multi-subcarrier modulation of the audiofrequency signal. The frequency spectrum of the digital signal is formed in the manner represented by curve A of FIG. 1 by a large number of regularly spaced subcarriers which are modulated independently of one another according to a multiple phase state modulation process of the type known for example as QAM standing for "Amplitude modulation on two quadrature paths". The frequency spectrum obtained occupies a bandwidth $B_n$ which is the sum of the frequency spectra of all the subcarriers. By virtue of the narrowness of the frequency spectrum of the individual subcarriers, the frequency spectrum of the digital signal as a whole appears to be very well delimited in frequency space, unlike the spectrum represented by curve B in FIG. 1 which is that obtained with a single-carrier digital modulation process.

Figure 2:
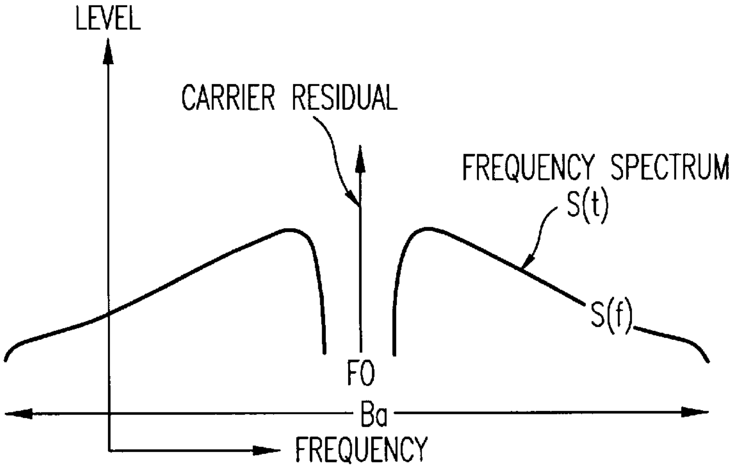
FIG. 2 illustrates the frequency spectrum of a wave modulated in accordance with the known principle of amplitude modulation.

The analog signal is transmitted using the known processes of double-sideband amplitude modulation or single-sideband, abbreviated SSB, amplitude modulation. In the case of amplitude modulation, also abbreviated to AM, the analogue signal is obtained by amplitude modulation of a pure carrier, taking proper care that the amplitude of the modulated signal never vanishes. In accordance with this type of modulation, a signal to be modulated S(t) gives rise at the output of a transmitter to a signal of the form $\cos(2\pi F_0 t)(S_0+S_{(t)})$ where $S_0$ is a bias guaranteeing a positive amplitude and $F_0$ is the frequency of the carrier. The frequency spectrum is formed as shown in FIG. 2 by two frequency bands each representing the spectrum $S_{(f)}$ of the signal $S_{(t)}$ which are arranged symmetrically with respect to the frequency $F_0$. In this process, the power conveyed by the carrier residual represents 70% of the total power transmitted, while the carrier residual does not by itself convey any information, the useful information being contained entirely in each of the spectra $S_{(f)}$.

Figure 3:
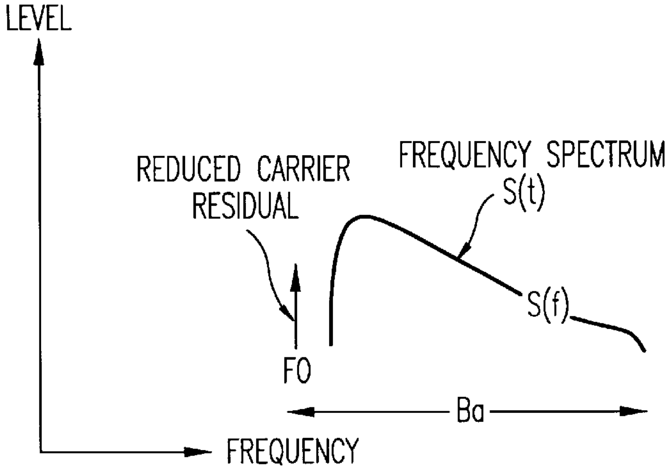
FIG. 3 illustrates the frequency spectrum of a wave modulated in accordance with the known principle of single-sideband wave modulation.
Figure 4:
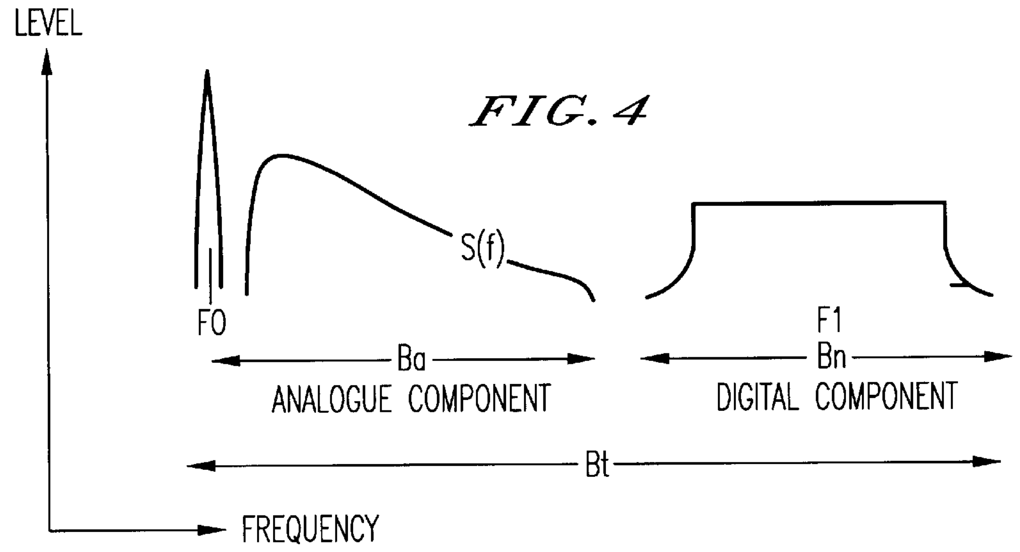

In accordance with the single-sideband type modulation, the spectral crowding obtained is as shown in FIG. 3 reduced by half. The modulation which may be viewed as amplitude modulation is filtered so as to allow through only one of the two halves of the frequency spectrum together with little or no carrier residual. The reduction in the transmission power varies as a function of the fraction of carrier residual. If this residual is eliminated completely, the necessary transmission power, for equivalent range, is then only 15% of that necessary for amplitude modulation AM. Unfortunately, since a straightforward receiver available on the market would appear to be incapable of correctly demodulating such a signal in particular when the carrier residual is absent, transmission must consequently take place with a carrier residual so as to limit the distortion which may invariably occur with an amplitude-modulation receiver.

As FIGS. 4 to 7 show, the composite signal which is transmitted according to the invention by a single transmitter is the sum of the analogue signal of bandwidth $B_a$ and of the digital signal of bandwidth $B_n$. In the alternative variants envisaged, the bandwidth of the signal S(t) is denoted $B_S$ and is much the same as the bandwidth $B_0$. $B_n$ denotes the bandwidth necessary for transmitting the bit rate of the digital signal associated with S(t). In all the variants of the spectral combinations envisaged, the high-pitched frequencies of the spectrum $S_{(f)}$ are arranged so as to be as close as possible to those of the digital signal. Thus, a possible inadvertent reception by an AM receiver available on the market of a few of the frequencies contained in the digital signal can result only in localized noise in the high-pitched frequencies, this being a lesser evil because noise in the high-pitched frequencies is perceptually less annoying than in the low-pitched frequencies and because an amplitude-modulation receiver available on the market strongly attenuates the high-pitched frequencies.

Knowing furthermore that, for the same transmission range, the signal/noise ratio necessary for a digital transmission is markedly less than that necessary for an analog transmission, the power conveyed by the digital component may be equal to or even less than that of the analog component, which amounts to saying that the total power transmitted may be much the same as or less than that necessary for an amplitude-modulation AM transmitter conveying only the analogue signal. In FIGS. 4 to 7 the gap between the frequencies $F_0$ and $F_1$ which respectively represent the frequency of the carrier residual for the analogue and the central frequency of the digital is determined so that the total band, denoted $B_t$, of the signal transmitted is compatible with the radiobroadcasting rules in use.

Figure 5:
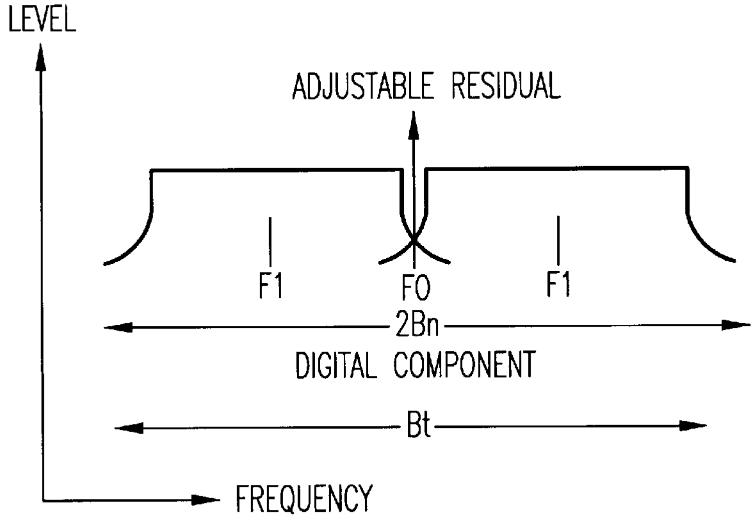
Figure 6:
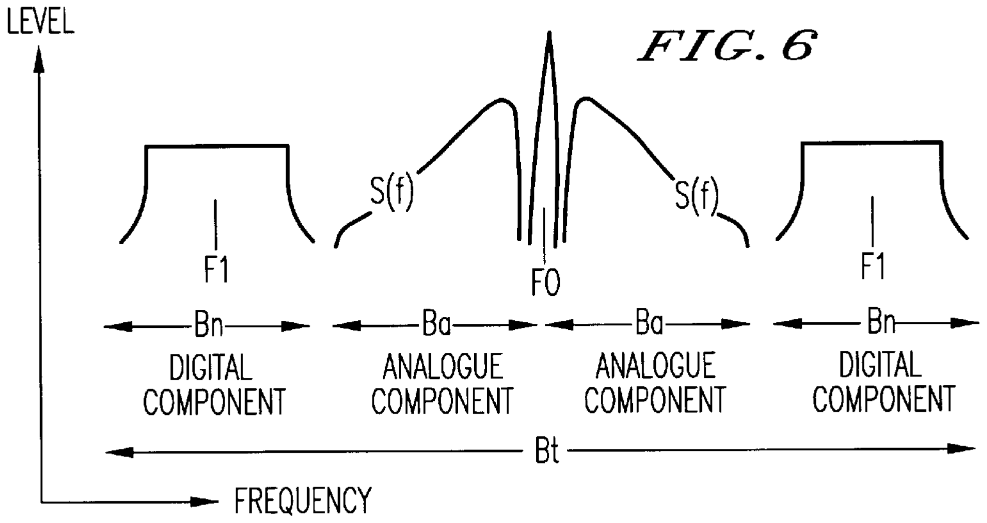

It is also possible to envisage as shown by FIG. 5 that in a transition period, the transmission using amplitude modulation AM of the digital signal alone may occupy on its own all the available band or else, as FIG. 6 shows, the simultaneous transmission using amplitude modulation of the analog and of the digital, it then being possible to regard the digital signal as a special "signalling" located beyond the high-pitched frequencies of the analog low-frequency signal $S_{(t)}$. According to yet another variant represented in FIG. 7 the transmission of the analogue signal using amplitude modulation AM or using modulation known by the abbreviation VSB (Vestigial Side Band) to limit the distortion in the low frequencies and of the digital in upper or lower sideband.

A device for implementing the process described above is represented in FIG. 8. This comprises a summator circuit 1 coupled by a first input to a first modulation path composed of an audiofrequency coder 2, of a multiplexer 3 of data provided by the coder 2, and of service and auxiliary data, and of a multi-subcarrier modulator 4 which are linked together in this order in series. Summator 1 is moreover coupled by a second modulation input to a second path composed essentially of a low-pass filter 5.

The output of the summator circuit 1 is coupled to the input of a modulation device 6 composed of an amplitude-modulation AM modulator or single-sideband SSB modulator. The modulated signal provided by the modulation device 6 is filtered by a sideband selector filter 7. A regulating device 8 is coupled between the output of the low-pass filter 5 so as to regulate the residual carrier level provided by the modulation device 6. The latter is composed in the manner represented in FIG. 9 of two paths. A first path comprises a device for estimating the minima of the signal $S_{(t)}$ coupled to a first input of a subtractor circuit 10 by way of a low-pass filter 11. A second path is composed of a delay circuit 12 for delaying by a specified duration T corresponding to the duration of the processing of the signal $S_{(t)}$ in the first path, coupled to a second input of the subtractor circuit 10 by way of a multiplier circuit 13 for multiplying by a target value 9.

Figure 8:
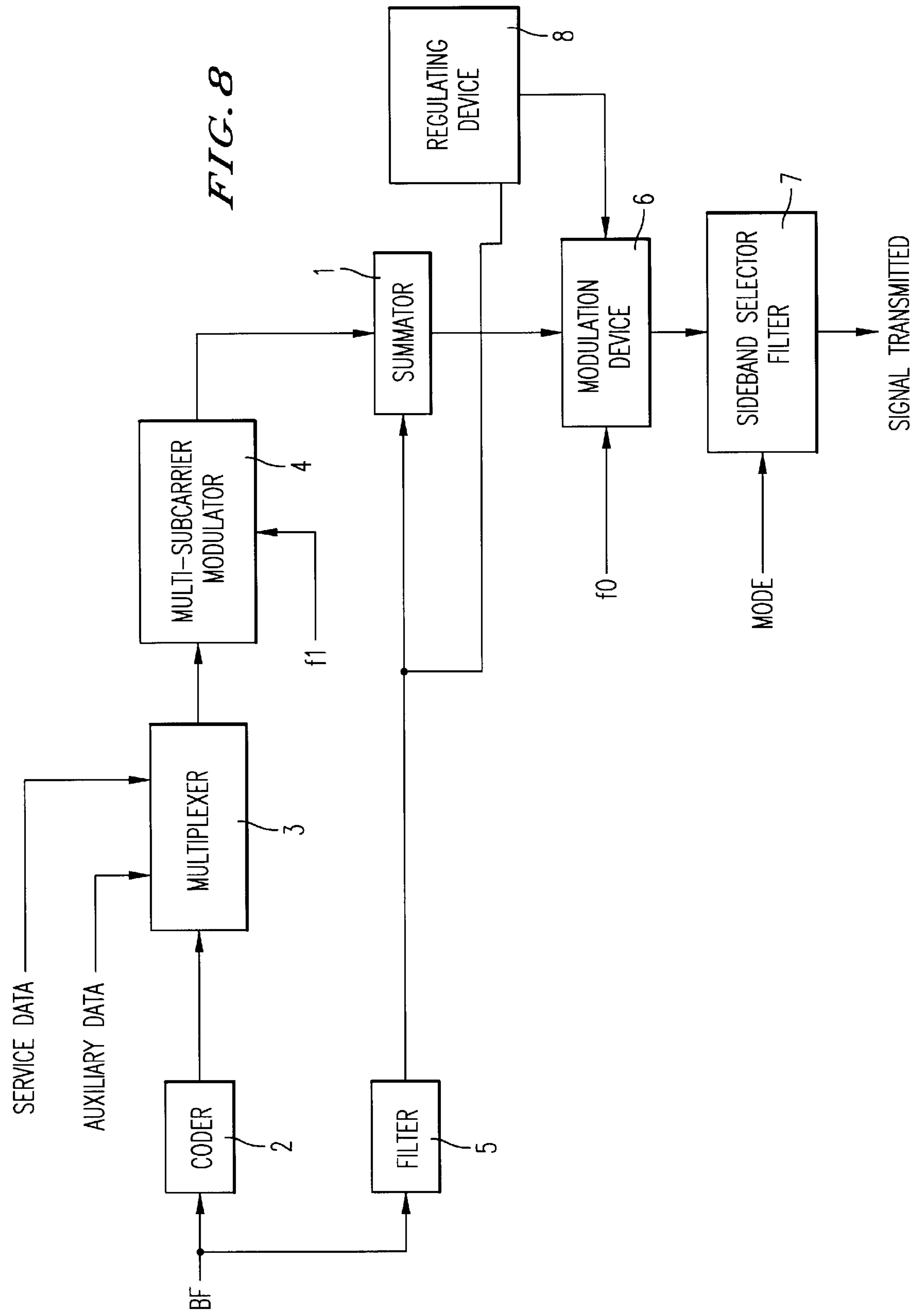
FIG. 8 illustrates an embodiment of a device for implementing the process according to the invention.

The output of the subtractor circuit 10 is linked to a control input of the modulation device 6 of FIG. 8. The signal $S_{(t)}$ is applied in accordance with this configuration simultaneously to the respective inputs of the device for estimating minima 9 and of the delay device 12. The regulating device 8 makes it possible to limit the wastage of energy represented by a large carrier residual, by continuously adjusting this residual as a function of the instantaneous power of the signal $S_{(t)}$. When the power level of the signal $S_{(t)}$ is of low power, the distortion is utterly negligible. For the other values of the signal $S_{(t)}$ the distortion is brought to an acceptable level. To do this, the minima of the signal $S_{(t)}$ are estimated continuously and filtered by the low-pass filter 11 whose cutoff frequency is for example 10 Hz so as to be inaudible and the value obtained is delayed by the delay T and is assigned a gain g less than 1 before being subtracted from the signal $S_{(t)}$.

The frequency spectrum of the resulting analogue signal emitted at the output of the selector filter 7 then has the shape represented in FIG. 10, the carrier residual being modulated with a very small bandwidth.

Figure 11A:
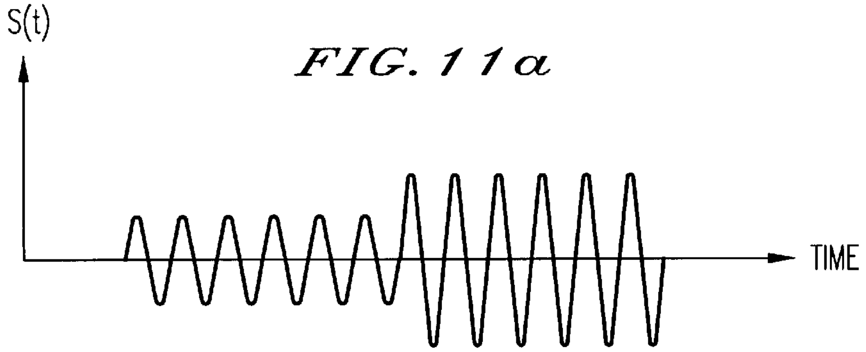
FIGS. 11*a*, 11*b* and 11*c* illustrates temporal waveforms of the carrier without or with modulation of the carrier residual obtained with the device of FIG. 9, as a function of the amplitude of the audiofrequency signal to be transmitted.
Figure 11B:
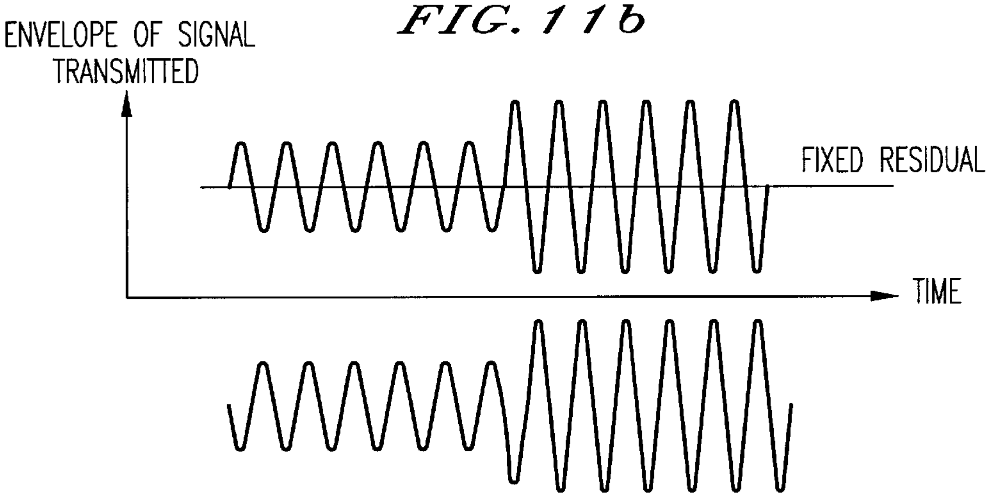
Figure 11C:
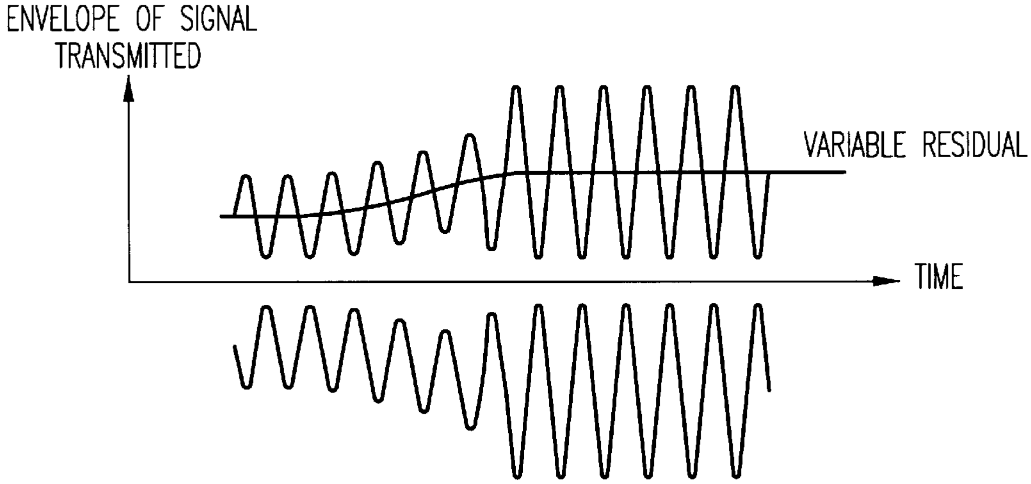

Temporal waveforms of the carrier without and with modulation of the residual are represented in FIGS. 11*a*, 11*b* and 11*c* as a function of the amplitude of the signal S(t).

What is claimed is:

1. A process of transmitting mixed analog and digital signals by one and the same transmitter and intended to be received either by amplitude-modulation receivers or single-sideband receivers and digital type receivers adapted for the demodulation of multi-subcarriers, said process comprising:

transmitting a composite signal whose frequency spectrum includes a first analog spectrum representative of an amplitude modulation or of a single sideband and of a second spectrum including the multi-subcarriers; and regulating a residual-carrier level of the mixed signal, wherein the first and second spectra occupy two disjoint frequency bands, wherein the spectrum of the analog signal is one of an amplitude-modulated signal, a single-sideband-modulated signal, and a VSB modulated signal, and wherein the spectrum of the digital signal includes a specified number of regularly spaced subcarriers which are modulated independently of one another according to a multiple phase state modulation process.

2. The process according to claim 1, further comprising:

placing the spectrum of the digital signal in a frequency band alongside frequencies corresponding to high-pitched frequencies of an original analog frequency band.

3. The process according to claim 2, further comprising:

simultaneously transmitting the analog and digital signals using amplitude modulation.

4. The process according to claim 2, further comprising:

simultaneously transmitting the analog signal using amplitude modulation and the digital signal using single sideband.

5. A device for transmitting mixed analog digital signals, comprising:

a summator circuit coupled by a first input to a first modulation path and a second input to a second modulation path;

said first modulation path including an audiofrequency coder, a multiplexer and a multi-subcarrier modulator which are linked in this order in series, and said second path including a low-frequency filter; and a regulating device coupled between an output of the low-pass filter and an output of the multi-subcarrier modulator so as to regulate the residual-carrier level provided by the modulation device, wherein an output of the summator circuit is coupled to an input of a modulation device having an amplitude-modulation or single-sideband modulator.

* * * * *